United States Patent
Choi

[11] Patent Number: 5,832,001
[45] Date of Patent: Nov. 3, 1998

[54] VARIABLE RATE VITERBI DECORDER

[75] Inventor: Young-Bae Choi, Seoul, Rep. of Korea

[73] Assignee: Daewoo Electronics Co., Ltd., Seoul, Rep. of Korea

[21] Appl. No.: 823,043

[22] Filed: Mar. 21, 1997

[30] Foreign Application Priority Data

Mar. 22, 1996 [KR] Rep. of Korea ............ 96-7974

[51] Int. Cl.$^6$ .................................................. H03M 13/12
[52] U.S. Cl. .......................................................... 371/43.2
[58] Field of Search ............................................ 371/43.2

[56] References Cited

U.S. PATENT DOCUMENTS

| | | | |
|---|---|---|---|
| 5,331,665 | 7/1994 | Busschaert et al. | 375/94 |
| 5,438,590 | 8/1995 | Tzukerman et al. | 375/259 |
| 5,509,020 | 4/1996 | Iwakiri et al. | 371/43 |
| 5,710,784 | 1/1998 | Kindred et al. | 371/43 |

Primary Examiner—Stephen M. Baker
Attorney, Agent, or Firm—IP Group of Pillsbury Madison & Sutro LLP

[57] ABSTRACT

A variable rate Viterbi decoder comprising: a signal generating means for generating a control signal according to an input code rate and a sampling clock; a memory for storing punctured coded data; a memory control means in which a signal for recognizing valid data is inputted, and a read signal and a write signal are generated according to an input clock, the sampling clock, and the control signal from the signal generating means; a depuncturing means for depuncturing the punctured coded data from the memory according to the sampling clock and the control signal from the signal generating means; and a Viterbi decoding means for decoding the depunctured data from the depuncturing means according to the sampling clock and the control signal from the signal generating means.

3 Claims, 4 Drawing Sheets

VARIABLE RATE VITERBI DECORDER

BACKGROUND OF THE INVENTION

1. Field of the Invention

The present invention relates to a variable rate Viterbi decoder, and more particularly to decoding and depuncturing punctured coded data according to each code rate and Viterbi algorithm in the receiving apparatus.

2. Description of the Prior Art

In general, digital data transmission through a physical channel in communication systems and data recording on a storage medium in computer systems have much in common. In both cases, digital data are transferred from the transmitting part to the receiving part. Since the channel and storage medium are subject to various types of noise, distortion, and interference, an output of the channel or storage medium differs from its input due to the errors that result during the storage and transmission of data. Therefore, there is a need for error control for processing massive amount of data in communication and storage systems. To satisfy this need, there is an Error Control Coding (ECC). References related to ECC are "Error-Correcting Coding Theory" written by Man Young Rhee (McGraw-Hill Publishing Company, 1989) and "Error Control Coding Fundamentals and Application" written by Shu Lin and Daniel J. Costello, Jr. (Prentice-Hall, Inc). In addition, the related arts are disclosed in U.S. Pat. Nos. 5,003.540, 5,115,436, 5,144, 304, and 5,396,239.

Channel codings for correcting errors are classified into two different types. a block coding and a non-block coding. The block coding is well known as Bose-Chaudhuri-Hocquenghen (BCH) coding or Reed-Solomon coding. For non-block coding, there is a convolution coding.

The block coding transmits codewords or frames of data blocks of constant length instead of continuous stream of data, and decodes the codewords or frames in the receiver. In block coding, a code rate is represented by k/n when input data of k-bit are coded to n-bit codewords or frames.

An example of convolution coding of non-block coding is disclosed in U.S. Pat. No. 4,809,277. The convolution coding codes and outputs data streans of faster bit rate than the input data streams. The code rate is represented by k/n, like the block coding in the convolution coding, however the encoded codewords or frames are not composed of data blocks of constant length. The convolution decoding decodes a codeword sequence encoded by the convolution coding in regenerating a message bit sequence, namely a bit sequence before it was coded. The most efficient method for decoding data coded by the convolution coding is based on "maximum likelihood decoding algorithm" of Viterbi algorithm.

Related materials to Viterbi decoding are disclosed in U.S. Pat. Nos. 4,606,027, 5,162,797, and 5,509,020. In accordance with the Viterbi algorithm, when two paths having different hamming distances meet each other, the paths are compared. After comparing them, the path having a shorter hamming distance is selected since it has a lower error rate, and the other path of longer hamming distance is erased from the path memory. The path having a shorter hamming distance is called surviving path. The surviving path is determined at every point and the path having a longer hamming distance is erased in order to decrease coding complexity and memory storage capacity.

In digital satellite broadcasting, a method for puncturing channel data is used to obtain a high transmitting rate. Recently, the puncturing method is widely used in the several digital transmission systems since it is 20% more efficient than the transmitting rate of previous methods.

A related art for puncturing coding is disclosed in U.S. Pat. No. 5,438,590. Prior to transmission, certain codewords are deleted from the rate ½ encoded data stream. This increases the code rate of a Forward Error Correction (FEC) system. The "code rate" refers to the ratio of information bit rate to the rate of transmitted codewords. At the receiving apparatus, the deleted codewords are replaced with "null" or "erased" symbols prior to being inputted to the rate ½ decoder.

The FIG. 1 illustrates a conventional system which utilizes the rate ¾ puncturing block. The system also comprises a rate ½ convolution encoder, a "null" symbol insertion block, and a rate ½ Viterbi decoder. The Quadrature Phase Shift Keying (QPSK) modulator (not shown) is most likely used for receiving the output from the rate ¾ puncturing block, in which each transmission symbol to be transmitted contains two codewords.

Each information bit is inputted to the rate ½ convolution encoder in order to generate a symbol. The symbol generated contains two codewords, C0(n) and C1(n). The encoded data from the rate ½ convolution encoder are inputted to the rate ¾ puncturing block to be punctured according to the puncturing pattern. In FIG. 1, the codewords C0(2) and C1(3) form one QPSK symbol, and the codewords C0(3) and C1(2) form other QPSK symbol, and they are respectively transmitted. Accordingly, each of the three information input bits are divided into two codewords and total of six codewords are generated. Of the six codewords generated from the three input bits, two are deleted by the puncturing process and the remaining four are transmitted, hence the rate ¾ of the rate ¾ depuncturing block (3 input bits/4 output codewords).

As transmitted symbols are inputted to the "null" symbol insertion block of the receiving part, the "null" or "erased" codeword is inserted in the punctured place in order to regenerate the codewords. The output data from the "null" symbol insertion block are inputted to the rate ½ Viterbi decoder for Viterbi decoding. Finally, the Viterbi decoding is performed in the rate ½ Viterbi decoder and the output data are returned to its original state prior to being inputted in the rate ½ convolution encoder of the transmitting part, namely to the state of the initial information bit.

The following table 1 shows the symbol puncturing pattern according to the code rate. The "0" indicates punctured codewords. The numerator and the denominator of the code rates respectively correspond to the input information bits and transmitted codewords. For example, in case of the code rate ½, one information bit is divided into two codewords to be transmitted, and in case of the code rate ⅞, seven information bits are divided into 8 codewords to be transmitted. Of the code rates in the table 1, the rates ½, ⅔, ¾, ⅚, and ⅞ are commonly used for the European Digital Video Broadcasting Standard.

TABLE 1

| Code rate | Symbol punctured pattern |
|---|---|
| ½ | R0: 1 |
|  | R1: 1 |
| ⅔ | R0: 10 |
|  | R1: 11 |
| ¾ | R0: 101 |

TABLE 1-continued

| Code rate | Symbol punctured pattern |
|---|---|
|  | R1: 110 |
| 4/5 | R0: 1000 |
|  | R1: 1111 |
| 5/6 | R0: 10101 |
|  | R1: 11010 |
| 6/7 | R0: 100101 |
|  | R1: 111010 |
| 7/8 | R0: 1000101 |
|  | R1: 1111010 |
| 11/12 | R0: 10001000001 |
|  | R1: 11110111110 |
| 12/13 | R0: 100000001010 |
|  | R1: 111111110101 |
| 14/16 | R0: 100110100101101 |
|  | R1: 111001011010010 |
| 16/17 | R0: 1010101101111010 |
|  | R1: 1101010010000101 |

FIG. 2 shows a block diagram for the related arts. The variable rate Viterbi decoder of the prior arts comprises a clock signal generating means, a memory control means, a memory, a depuncturing means, and a Viterbi decoding means. The clock signal generating means is embodied with a Phase Locked Loop (PLL) circuit (not shown) of Q1401 manufactured by the Qualcomm Inc. or of L64705 manufactured by the LSI Logic Inc.

In variable rate Viterbi decoder of FIG. 2, the PLL circuit equivalent to the means for generating a clock signal generates an output clock (OCLK) according to an input clock (ICLK) from the QPSK demodulator (not shown). The input clock (ICLK) differs from the output clock (OCLK) since the input clock (ICLK) is a clock for codewords transmitted through the channel and the output clock (OCLK) is a clock for regenerating the information bits.

In memory control means, a signal for recognizing valid data (DVALID_IN) is inputted, and a write signal according to the input clock (ICLK) from the QPSK demodulator is outputted. Further, according to the output clock (OCLK) from the clock signal generating means, a read signal is outputted.

In memory, data ($R_0$, $R_1$) are stored and outputted according to the write signal and the read signal from the memory control means.

In depuncturing means, depuncturing is performed on the punctured coded data from the memory according to the output clock (OCLK) from the clock signal generating means.

In Viterbi decoding means, Viterbi decoding is performed on the depunctured data from the depuncturing means according to the output clock (OCLK) signal from the clock signal generating means.

As described above, the prior Viterbi decoder includes a clock signal generating means, which is embodied with a PLL circuit in order to synchronize the input data and the output data from the memory. Consequently, the Viterbi decoders of the prior arts has a complex structure constrained by the limitations of analog system, hence increasing its manufacturing cost.

SUMMARY OF THE INVENTION

Accordingly, it is an object of the present invention to provide a variable rate Viterbi decoder, which decodes and depunctures punctured coded data according to each code rate and Viterbi algorithm in the receiving end of the data transmission.

In order to achieve the above object, the present invention provides a variable rate Viterbi decoder comprising: a signal generating means for generating a control signal according to an input code rate and a sampling clock; a memory for storing punctured coded data; a memory control means in which a signal for recognizing valid data is inputted, and a read signal and a write signal are generated according to an input clock, the sampling clock, and the control signal from the signal generating means; a depuncturing means for depuncturing the punctured coded data from the memory according to the sampling clock and the control signal from the signal generating means; and a Viterbi decoding means for decoding the depunctured data from the depuncturing means according to the sampling clock and the control signal from the signal generating means.

Accordingly, the present invention can efficiently perform the depuncturing and Viterbi decoding process by having a signal generating means, which outputs an appropriate control signal according to the input code rate and the sampling clock. With the advantages of the present invention, the constraints from the limitations of analog circuit are eliminated and the structure complexity of the hardware is simplified as a result, hence decreasing its manufacturing cost.

BRIEF DESCRIPTION OF THE DRAWINGS

The above and other objects, features, and advantages of the present invention will be apparent from the following detailed description of the preferred embodiments of the invention in conjunction with the accompanying drawings, in which.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 1:
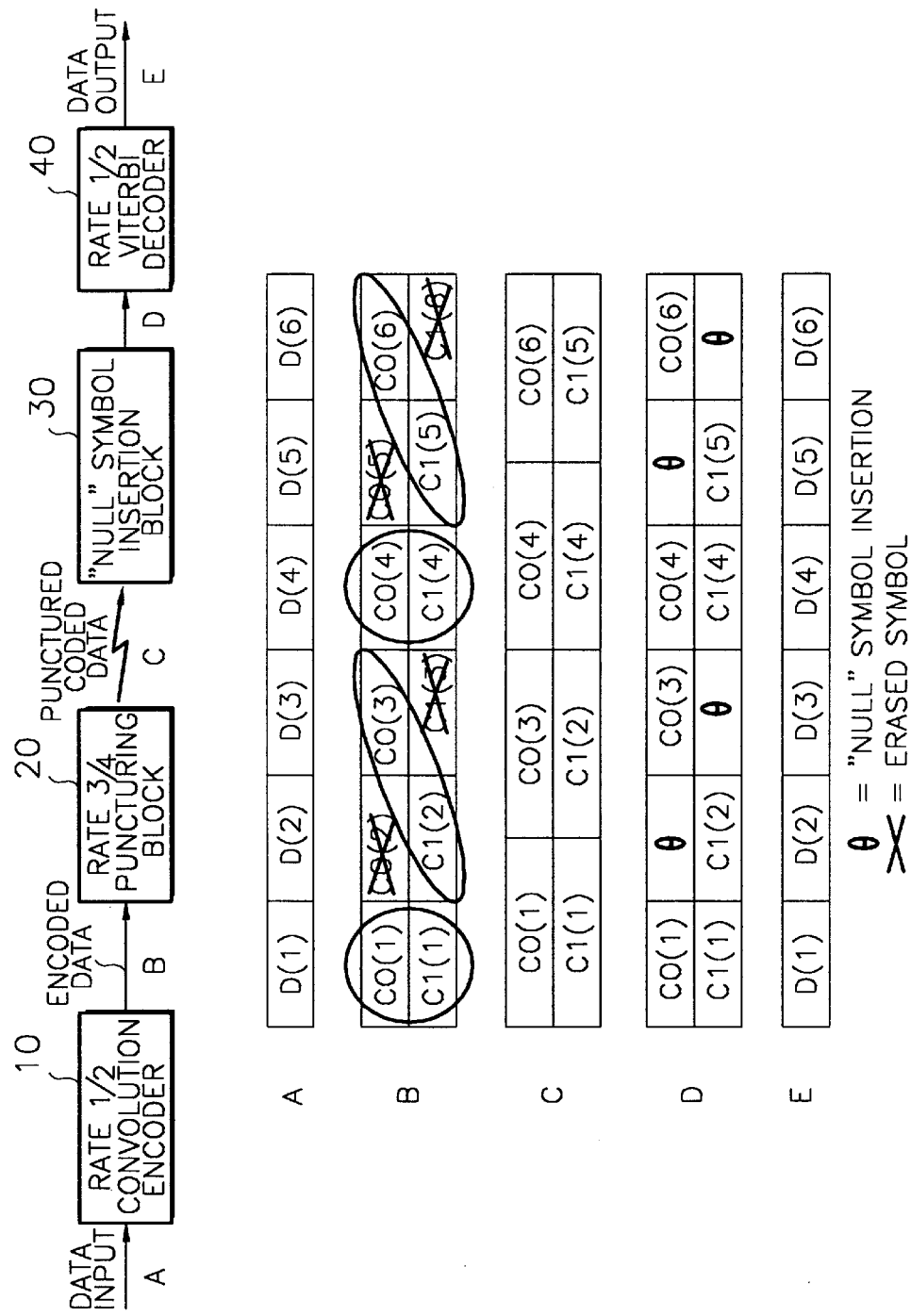
FIG. 1 is a block diagram illustrating a conventional system, which uses rate 3/4 puncturing coding method, for describing in detail the process of rate 3/4 puncturing coding method.
Figure 2:
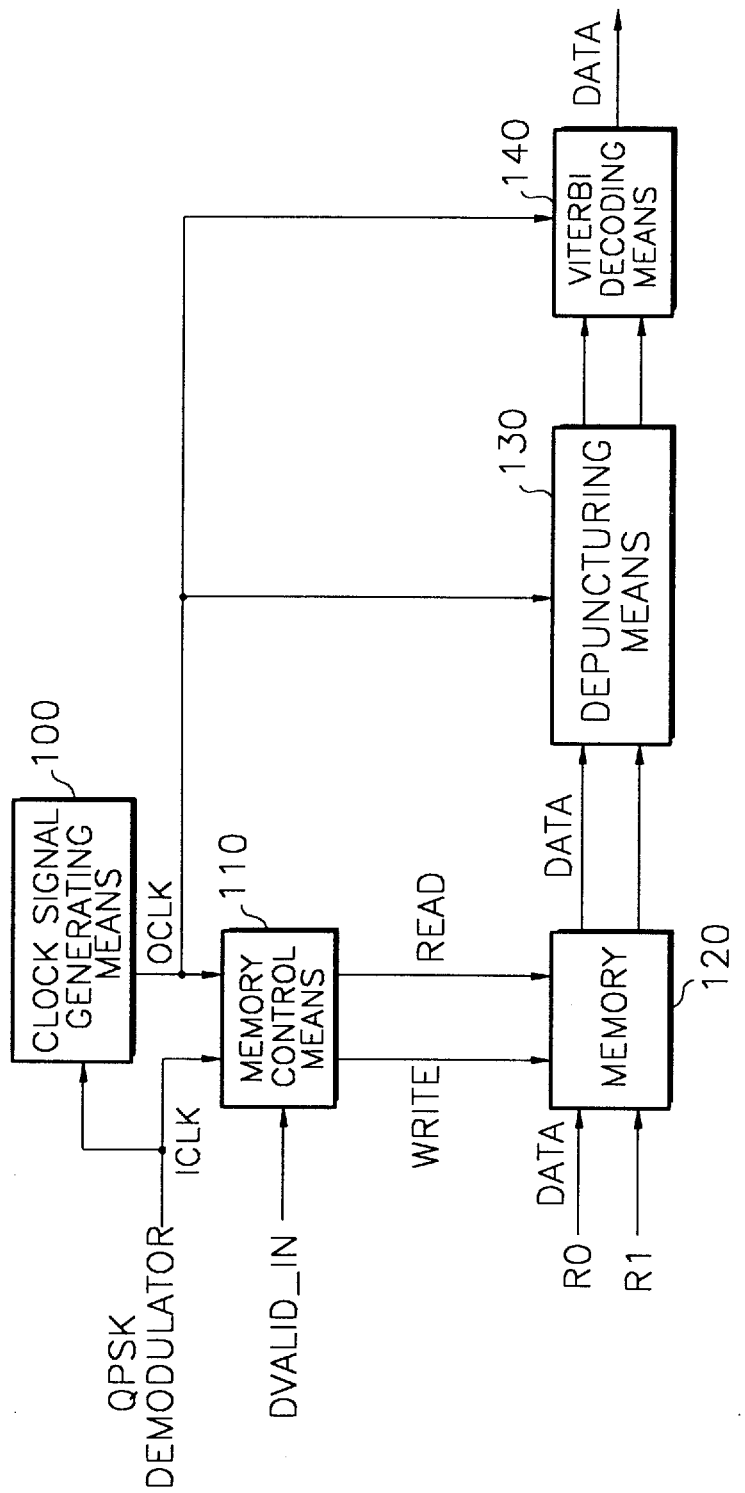
FIG. 2 is a block diagram illustrating a conventional variable rate Viterbi decoder.
Figure 3:
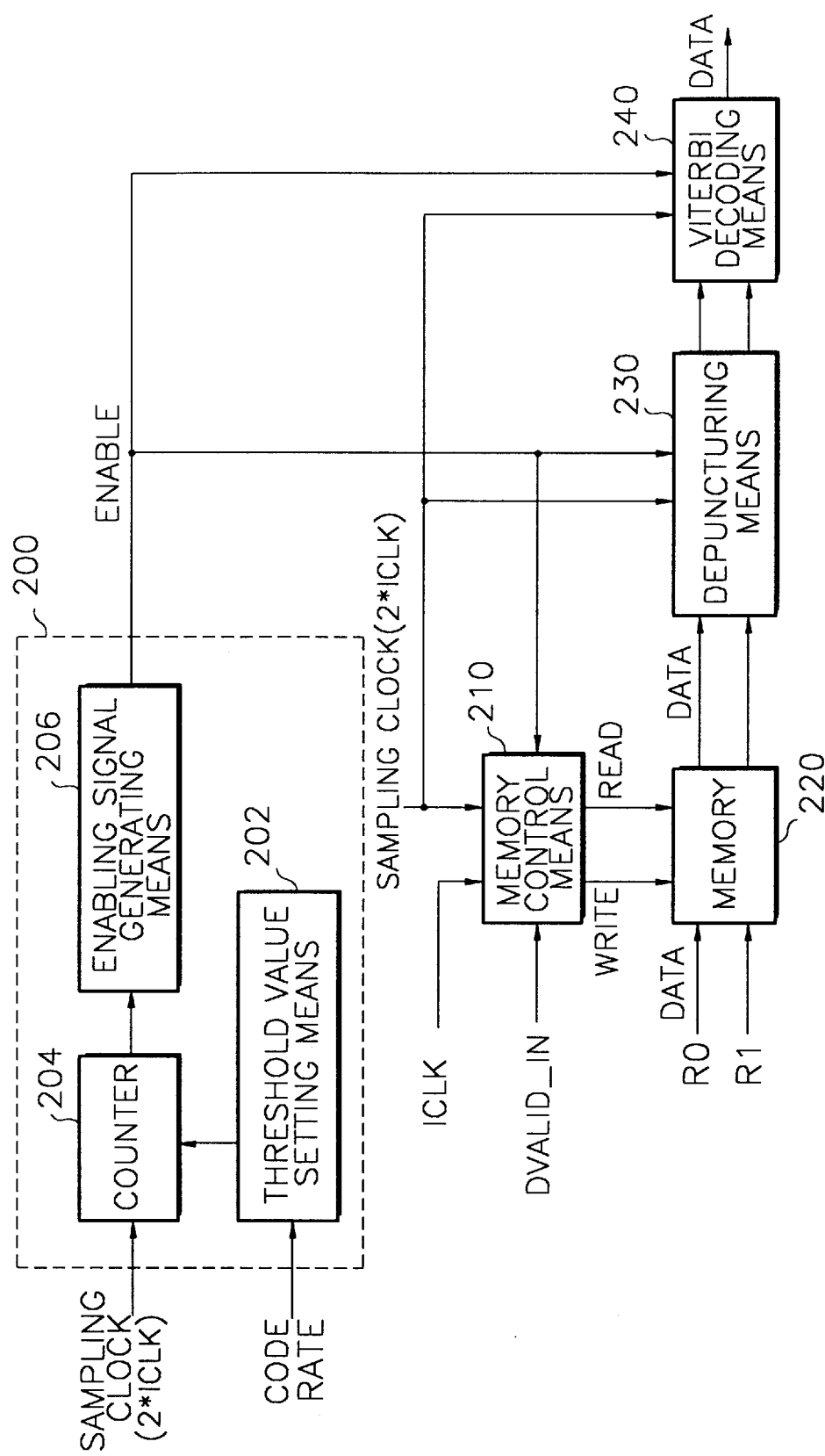
FIG. 3 is a block diagram illustrating a variable rate Viterbi decoder in accordance with the present invention.

FIG. 3 shows a block diagram of a variable rate Viterbi decoder in accordance with the present invention. The variable rate Viterbi decoder of the present invention is designed for five code rates (1/2, 2/3, 3/4, 5/6, 7/8) required for satisfying the European Digital Video Broadcasting Standard.

A variable rate Viterbi decoder comprises a signal generating means 200, a memory control means 210, a memory 220, a depuncturing, means 230, and a Viterbi decoding means 240.

The signal generating means 200 comprises a threshold value setting means 202, a counter 204, and an enabling signal generating means 206.

The memory 220 is embodied with a RAM of First In First Out (FIFO) type to buffer input and output data.

Next, the operations and its effect will be described in detail accordance with a preferred embodiment of the present invention.

Figure 4:
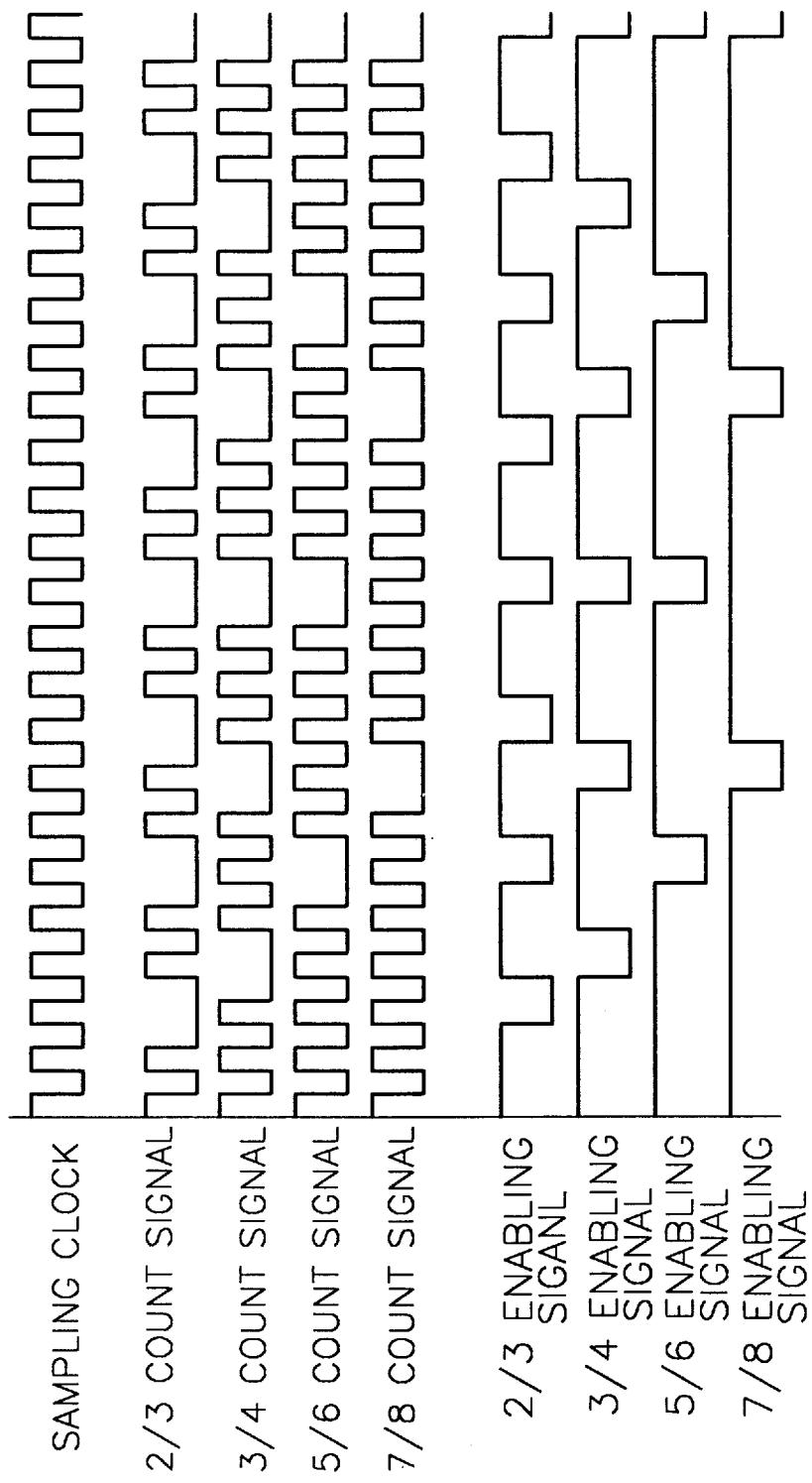
FIG. 4 is a view illustrating the waveform of sampling clock, the waveform of count signals, and the waveform of enabling signals in accordance with a preferred embodiment of the present invention.

FIG. 4 shows the waveform of the sampling clock, the waveforms of count signals for the code rates (⅔, ¾, ⅚, ⅞), and the waveforms of enabling signals for the corresponding code rates. In addition, FIG. 4 illustrates the code rates (⅔, ¾, ⅚, ⅞), of code rates in table 1, of the European Digital Video Broadcasting Standard.

The clocks used for decoding process are a symbol clock used for an input clock and a sampling clock (2*ICLK) for transforming analog signal to digital signal. The characteristic of a sampling clock (2*ICLK) is illustrated in FIG. 4.

The sampling clock (2*ICLK) of the highest frequency necessary is used in the present invention to eliminate the need for another circuit. Accordingly, even the highest code of the European Digital Video Broadcasting Standard can be accommodated by the system, namely the code rate ⅞ requiring ⅞ of the sampling frequency. For example, the new frequency required for [(⅞)×sampling frequency] is not generated, but the required sampling clock is relayed to the main clock to generate corresponding enabling signal for the code rate ⅞.

As illustrated in FIG. 3 to FIG. 4, the signal generating means 200 generates enabling signals according to the code rates shown in Table. 1. Namely, in the threshold value setting means 202 of the signal generating means 200, one of the code rates of the European Digital Video Broadcasting Standard ½, ⅔, ¾, ⅚, or ⅞ is inputted and the numerator of the input code rate is determined as the threshold value. The counter 204 of the signal generating means 200 counts a sampling clock illustrated in FIG. 4 according to the threshold value set in the threshold value setting means 202 in order to generate a counting signal illustrated in FIG. 4. The enabling signal generating means 206 generates enabling signals, illustrated in FIG. 4, according to the counting signal from the counter 204. For example, if the code words with the code rate ⅞ are inputted in the threshold value setting means 202, the numerator of the code rate, namely 7 is set as the threshold value. At this time, the counter 204 counts the sampling clock until the threshold value comes to 7, and the enabling signal generating means 206 outputs the enabling signals until the clock reaches to 7. Additionally, the enabling signal generating means 206 also generates a disabling signal when the clock reaches to 8.

In memory control means 210, a signal for recognizing valid data (DVALID_IN) and enabling signals are inputted. In addition, a write signal and a read signal are outputted according to an input clock from a QPSK demodulator (not shown). The read address signal is synchronized with the rate of the depuncturing means 230 when generating an address signal for the data outputted from the memory 220.

In memory 220, the data are stored according to the write signal from the memory control means 210, and the data are outputted according to the read signal.

In depuncturing means 230, the coded data from the memory 220 are inputted according to the sampling clock (2*ILCK) and the enabling signals in order to be depunctured.

In Viterbi decoding means 240, the depunctured data from the depuncturing means 230 are inputted according to the sampling clock (2*ILCK) and the enabling signals in order to be processed by the Viterbi decoding.

Accordingly, the circuits of the present invention in which the described enabling signals are inputted have the frequency equivalent to the frequency generated in the PLL circuits of the prior arts, namely [code rate×sampling frequency].

As described above, the variable rate Viterbi decoder depunctures data in order to perform the Viterbi decoding, and generates frequencies according to each code rate by using the enabling signals generated according to the sampling clock and the code rate. Accordingly, the size and the complexity of hardware, resulting from the limitations of analog system, are decreased since the need for PLL circuit is eliminated, hence decreasing the manufacturing cost.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A variable rate Viterbi decoder comprising:

a) a signal generating means for generating a control signal according to an input code rate and a sampling clock;

b) a memory for storing punctured coded data;

c) a memory control means in which a signal for recognizing valid data is inputted, and a read signal and a write signal are generated according to an input clock, the sampling clock, and the control signal from said signal generating means;

d) a depuncturing means for depuncturing the punctured coded data from said memory according to the sampling clock and the control signal from said signal generating means; and e) a Viterbi decoding means for decoding the depunctured data from said depuncturing means according to the sampling clock and the control signal from said signal generating means.

2. The variable rate Viterbi decoder according to claim 1, wherein said signal generating means comprises a threshold value setting means for setting the numerator of the code rate as a threshold value when the code rate is recognized; a counter for generating a counting signal by counting the sampling clock according to the threshold value set in said threshold value setting means for setting a threshold value; and an enabling signal generating means according to the counting signal from said counter.

3. The variable rate Viterbi decoder according to claim 1, wherein said memory is embodied with a RAM of the First In First Out (FIFO) type to buffer input and output data.

* * * * *